United States Patent [19]
Tsang

[11] Patent Number: 5,346,581
[45] Date of Patent: Sep. 13, 1994

[54] METHOD OF MAKING A COMPOUND SEMICONDUCTOR DEVICE

[75] Inventor: Won-Tien Tsang, Holmdel

[73] Assignee: AT&T Bell Laboratories, Murray Hill, N.J.

[21] Appl. No.: 42,385

[22] Filed: Apr. 1, 1993

[51] Int. Cl.$^5$ .................. C30B 25/20; C30B 25/04
[52] U.S. Cl. ............................... 117/97; 156/643
[58] Field of Search .................. 156/612, 643; 437/31, 437/32, 126, 129, 133, 105, 228, 946, 80; 148/DIG. 17, DIG. 143

[56] References Cited

U.S. PATENT DOCUMENTS

| | | | |
|---|---|---|---|
| 4,659,401 | 4/1987 | Reif et al. | 156/612 |
| 4,897,361 | 1/1990 | Harriott et al. | 437/24 |
| 4,981,811 | 1/1991 | Feygenson et al. | 437/228 |
| 5,106,764 | 4/1992 | Harriott et al. | 437/18 |
| 5,120,393 | 6/1992 | Kubo et al. | 156/612 |
| 5,164,040 | 11/1992 | Eres et al. | 156/612 |

OTHER PUBLICATIONS

"Progress in Chemical Beam Epitaxy", by W. Tsang, *Journal of Crystal Growth*, vol. 105 (1990), pp. 1-29.
"Advances in MOVPE, MBE, and CBE", by W. Tsang, *Journal of Crystal Growth*, vol. 120, pp. 1-24, 1992.
"Selective Area Growth of Heterostructure Bipolar Transistors by Metalorganic Molecular Beam Epitaxy", by R. A. Hamm et al., *Applied Physics Letters*, vol. 61, No. 5, Aug. 3, 1992, pp. 592-594.
"Etching of InP by HCl in an OMVPE Reactor", by C. Caneau et al., *Journal of Crystal Growth*, vol. 107, 1991, pp. 203-208.
"Molecular-beam-epitaxial Growth of n-AlGaAs on Clean $Cl_2$-Gas etched GaAs Surfaces and the Formation of High Mobility Two-Dimensional Electron Gas at the Etch-regrown Interfaces", by Y. Kadoya et al., *Applied Physics Letters*, vol. 61, No. 14, Oct. 5, 1992, pp. 1658-1660.
"Selective Area Growth of GaAs and $In_{0.53}Ga_{0.47}As$ Epilayer Structures by Chemical Beam Epitaxy Using Silicon Shadow Masks: A Demonstration of the Beam Nature", by W. Tsang, *Applied Physics Letters*, vol. 46, No. 8, Apr. 15, 1985, pp. 742-744.

Primary Examiner—R. Bruce Breneman
Assistant Examiner—Ramamohan Rao Paladugu
Attorney, Agent, or Firm—Eugen E. Pacher

[57] ABSTRACT

In a preferred embodiment, the disclosed method of making a compound semiconductor (e.g., InP, GaAs) device comprises etching of a semiconductor body by exposure of the body to a chemical beam or beams that comprise an etching medium (e.g., $PCl_3$, $AsCl_3$) and a precursor chemical (e.g., trimethylindium, trimethylgallium), followed by chemical beam epitaxy (CBE) growth of semiconductor material on the etched surface without exposure of the semiconductor body to the ambient atmosphere. Presence of the precursor chemical in the etching beam can result in significantly improved surface morphology, with attendant high quality re-growth. Multiple etching/growth sequences are facilitated by the almost instantaneous (e.g., about 1s) switching between the etching and growth modes that is possible in a reactor according to the invention.

10 Claims, 4 Drawing Sheets

METHOD OF MAKING A COMPOUND SEMICONDUCTOR DEVICE

FIELD OF THE INVENTION

This invention pertains to methods of making compound semiconductor (typically III/V semiconductor) devices that comprise semiconductor material removal by exposure of a semiconductor body to a reactive chemical medium.

BACKGROUND OF THE INVENTION

Chemical beam epitaxy (CBE) is a very versatile semiconductor epitaxial growth technique that utilizes beams of compound ("precursor") chemicals directly impinging onto a heated semiconductor substrate surface. See, for instance, W.T. Tsang, *Journal of Crystal Growth*, Vol. 105, p. 1 (1990); and W.T. Tsang, *Journal of Crystal Growth*, Vol. 120, p. 1 (1992), both incorporated herein by reference. Under properly controlled conditions, decomposition of the arriving precursor chemicals results in the incorporation of the desired elements to produce an epitaxial film on a single crystal substrate.

Etching of some III/V semiconductors by exposure to an appropriate gaseous medium is also known. For instance, GaAs etching by chlorine ($3 \times 10^{-4}$ Torr $Cl_2$, 200° C.) gas in a vacuum chamber has been reported. See R.A. Hamm et al., *Applied Physics Letters*, (Vol. 61, p. 592 (1992). The etching of InP and GaAs by HCl in a MOVPE reactor (e.g., 76 Torr HCl, 625° C.) has also been reported. See for instance, C. Caneau et al., *Journal of Crystal Growth*, Vol. 107, p. 203 (1991).

Y. Kadoya et al., *Applied Physics Letters*, Vol. 61 (14), p. 1658, disclose etching GaAs by exposure to $Cl_2$ (3 minutes, 150° C.) in an etch chamber, transferring the sample to a MBE growth chamber through a UHV transfer tunnel, followed by growth of epitaxial AlGaAs by MBE (at 580° C.) on the etched surface.

U.S. Pat. No. 4,897,361 discloses patterning of a semiconductor mask layer by a technique that comprises exposure to an ion beam and dry etching, followed by in-situ growth of epitaxial semiconductor material, all without exposure of the sample of the ambient atmosphere. See also U.S. Pat. No. 5,106,764.

Certain disadvantages are associated with prior art etching techniques, including the multi-chamber etch/-growth techniques. For instance, it is typically not possible to switch rapidly (e.g., within about 1 s) from etching to growth or vice versa. This is a disadvantage in the manufacture of devices that require multiple etching/growth sequences. Furthermore, prior art low pressure techniques typically are limited to substrate temperatures below the preferential evaporation temperature of the group V element or elements (e.g., ≲300° C. for InP), in order to prevent surface morphology degradation. Prior art techniques are also limited with regard to possible modification of surface chemistry.

This application discloses a method of making compound semiconductor devices that substantially overcomes one or more of the recited disadvantages associated with prior art etching techniques.

GLOSSARY OF TERMS

A "beam" of particles (typically molecules) herein is a substantially unidirectional flux of particles of substantially defined lateral extent in an evacuated (background pressure typically less than $10^{-2}$ Torr) vessel.

In the context of epitaxial growth of III/V semiconductor material, a "precursor" chemical is a chemical compound which, upon decomposition at the heated semiconductor surface, yields a constituent of the desired III/V semiconductor material.

In the context of removal (etching) of epitaxial III/V semiconductor material, a "gaseous etching medium" is a gaseous medium that comprises at least one species which can, upon contact with the semiconductor material, combine with a constituent of the semiconductor material to form a volatile species.

By "epitaxial" semiconductor material I mean herein first semiconductor material that is grown on a second semiconductor substrate such that the crystal orientation of the former is determined by that of the latter. The composition of the first material need not be different from that of the second material.

SUMMARY OF THE INVENTION

In a broad aspect the instant invention is embodied in an improved method of making compound semiconductor devices.

More specifically, the method comprises providing a semiconductor substrate that comprises (typically epitaxial) III/V semiconductor material (e.g., GaAs, InP, InGaAs), and removing at least some of the III/V semiconductor material by a process that comprises contacting at least a part of the III/V semiconductor material with a gaseous etching medium (e.g., comprising $PCl_3$, $AsCl_3$, carbon tetrachloride, trichlorethane, or other compounds that comprise one or more of F, Cl, Brand I). Subsequent to the removal step, typically one or more further steps are carried out towards completion of the device.

Significantly, the removal step is carried out in a reactor that comprises means that facilitate simultaneous exposure of the III/V semiconductor material to the gaseous etching medium and to a precursor chemical. In preferred embodiments the etching step comprises exposing the III/V semiconductor material to a beam that comprises the etching medium and at least one precursor chemical, typically a compound (e.g., trimethylindium, trimethylgallium) that contains a column III element (e.g., In, Ga). The background pressure in the reactor chamber during etching is less than $10^{-2}$ Torr.

Typically, after completion of the etching step, epitaxial III/V semiconductor material is growth on at least some of the etched surface by a process that comprises exposing the surface to a beam of precursor chemicals (e.g., P, As, trimethylindium trimethylgallium, triethylindium, triethylgallium) in the reactor chamber, with less than $10^{-2}$ Torr background pressure. Advantageously, changing from etching to regrowth is accomplished simply by gas switching. This can be accomplished substantially instantaneously, e.g., in about 1 s. Of course, growth of epitaxial semiconductor material can also precede the etching step, and execution of a multistep sequence (e.g., comprising epitaxial growth, patterned etching, selective epitaxial regrowth), all in the same reactor, without exposure of the material to the ambient atmosphere, is contemplated.

The above referred to step or steps towards completion of the device optionally comprise the above discussed re-growth step, and typically comprise one or more of such conventional steps as photolithography, etching, metalization, dicing, packaging and testing.

DETAILED DESCRIPTION

Figure 1:
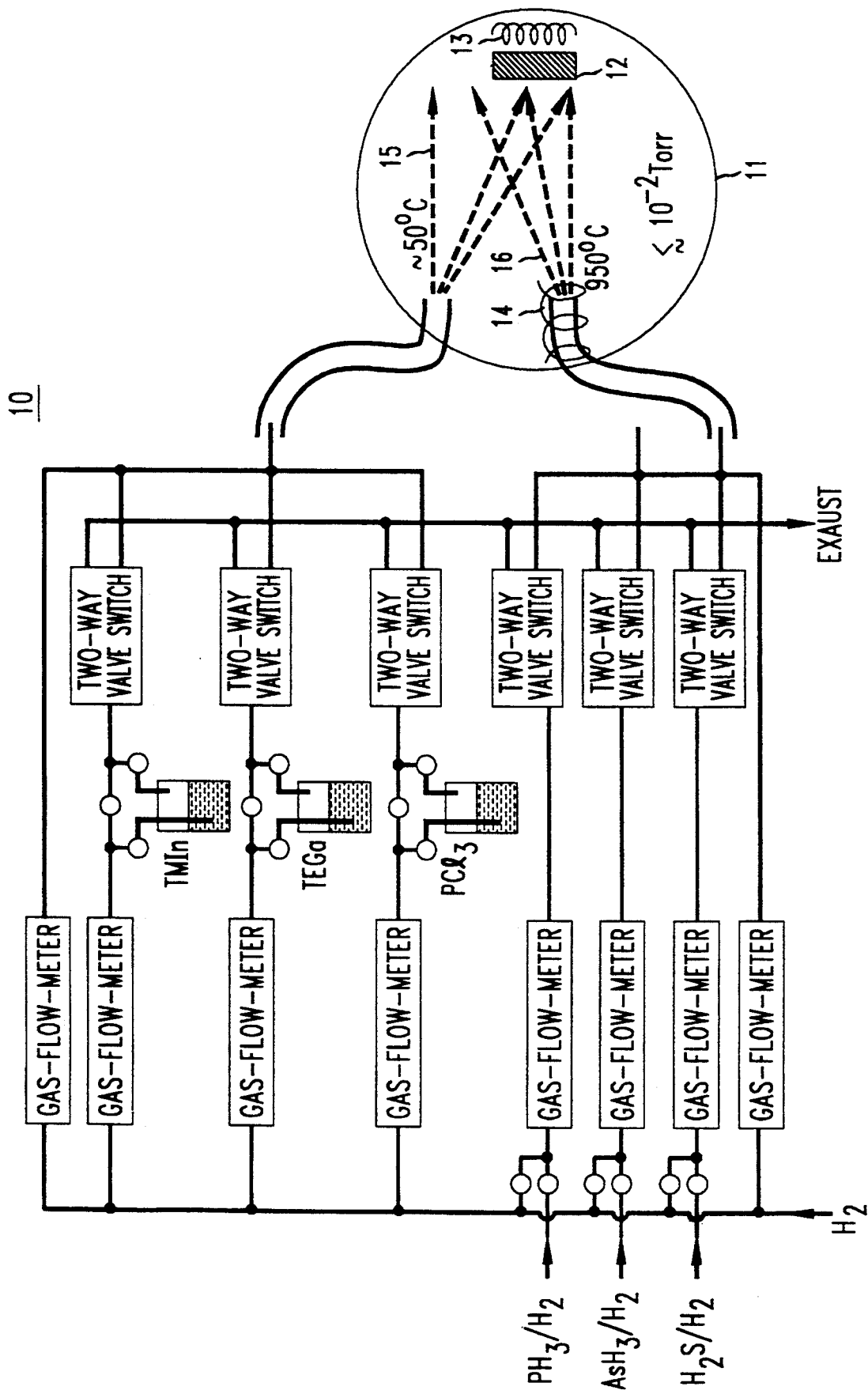
FIG. 1 schematically shows relevant aspects of a apparatus that can advantageously be used in the practice of the invention.

FIG. 1 schematically depicts relevant aspects of apparatus that can be advantageously employed in the practice of the invention. As those skilled in the art will recognize, apparatus 10 substantially resembles conventional CBE apparatus (e.g., a commercially available Riber 3200 system), differing from the prior art apparatus primarily with respect to the gas handling and beam forming means. Whereas prior art apparatus comprises means for exposing a sample to a beam of precursor compounds (and possibly one or more inert constituents), the novel apparatus comprises means that facilitate exposing the sample to a beam that comprises an etching compound, and that facilitate exposing the sample simultaneously to an etching medium and a precursor compound. This novel type of apparatus will be referred to as "reactive chemical beam epitaxy" (RCBE) apparatus.

In FIG. 1, numeral 11 refers to the etching/growth chamber, 12 to conventional wafer holding means, and 13 to conventional means for heating the semiconductor body. The background pressure in the chamber will generally be less than about $10^{-2}$ Torr. The gas handling system exemplarily facilitates introduction into the chamber of two gas streams of predetermined composition and mass flow rate. FIG. 1 schematically shows an exemplary system that provides a first beam 15 which can comprise one or more of $PCl_3$ TEGa and TMIn, and typically also comprises a carrier gas, e.g., $H_2$. The exemplary system also provides a second beam 16 that can comprise one or more of $PH_3$, $AsH_3$ and $H_2S$, and typically also comprises a carrier gas, e.g., $H_2$. Heating means 14 are provided to optionally decompose ("pre-crack") $AsH_3$ or $PH_3$. Conventional means for evacuating chamber 11 and for maintaining the background pressure at the desired low value are provided but not shown.

As those skilled in the art will appreciate, the gas flows introduced into chamber 11 will, in consequence of the low background pressure in the chamber, exhibit substantially unidirectional flow of particles, i.e., form "beams". They will also appreciate that beams 15 and 16 can be present simultaneously, and that RCBE apparatus could have fewer or more than two beams.

Growth of epitaxial III/V semiconductor material by CBE is well known and requires no further discussion. The discussion below will primarily pertain to the etching of InP. This is for the sake of clarity only, and the invention method can be readily applied to InP-based materials (e.g., InGaAsP alloys), and to GaAs and to GaAs-based materials (e.g., AlGaAs alloys). I even consider it likely that the principles of the method can be applied in the manufacture of II/VI semiconductor devices.

Although InP can be etched by exposure to a beam of, e.g., $Cl_2$ or HCl, $PCl_3$ is the currently preferred reactive constituent of the gaseous etching medium. Among the advantages of $PCl_3$ over $Cl_2$ or HCl are the following: $PCl_3$ is readily available in high purity, and it provides some phosphorus over-pressure at the InP surface. The former is important, since $PCl_3$ is injected directly into the reactor chamber, and the latter provides some stabilization for the InP surface. $PCl_3$ reacts readily with the InP surface to produce volatile reaction products (typically indium chloride or chlorides). Similar remarks apply to $AsCl_3$, which can advantageously be used to etch GaAs.

Exemplarily, I have etched sulfur-doped InP by exposure to a beam of $PCl_3$ in $H_2$ carrier gas ($PCl_3$ concentration 100–16%), with the semiconductor material at temperatures above 300° C. (e.g., 400–580° C.), and with a background pressure in the reactor chamber of about $5 \times 10^{-5}$ Torr. During heat-up and cool down respectively to and from the etching temperature, the InP sample was exposed to a sufficient phosphorus flux from pre-cracked $PH_3$ to prevent surface damage. Optionally, pre-cracked $PH_3$ can also be supplied during etching.

Figure 2:
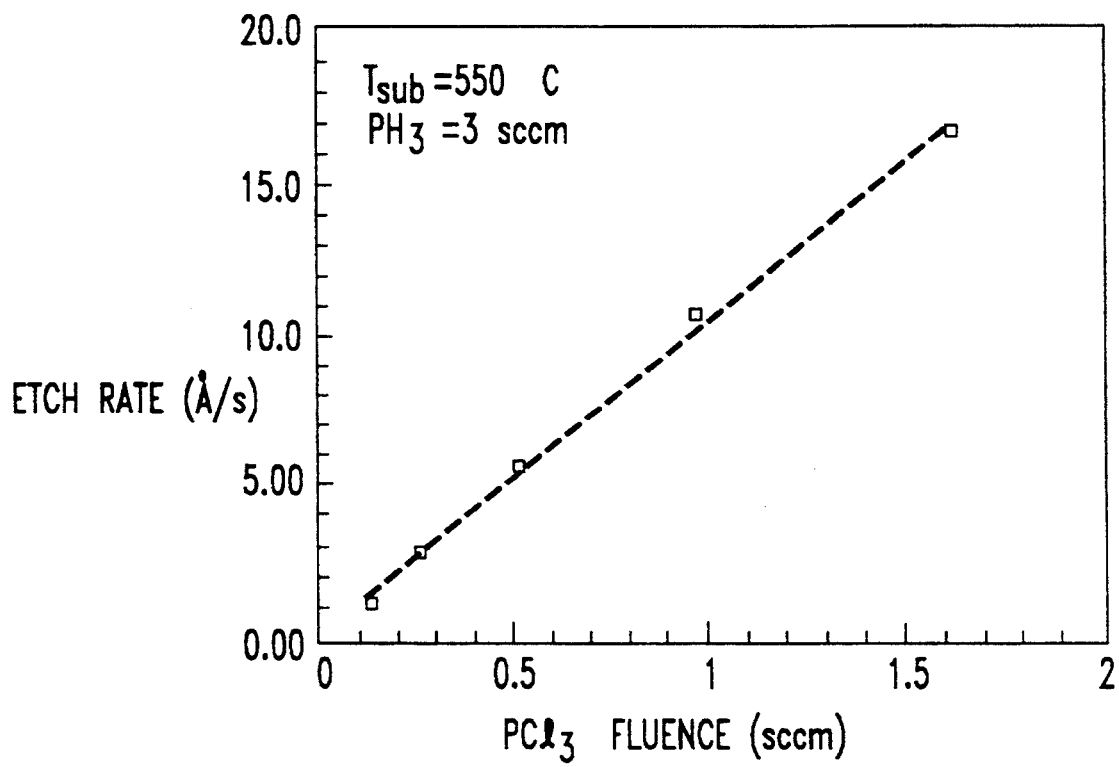
FIGS. 2 and 3 show data on etch rate vs. $PCl_3$ fluence and sample temperature, respectively.
Figure 3:
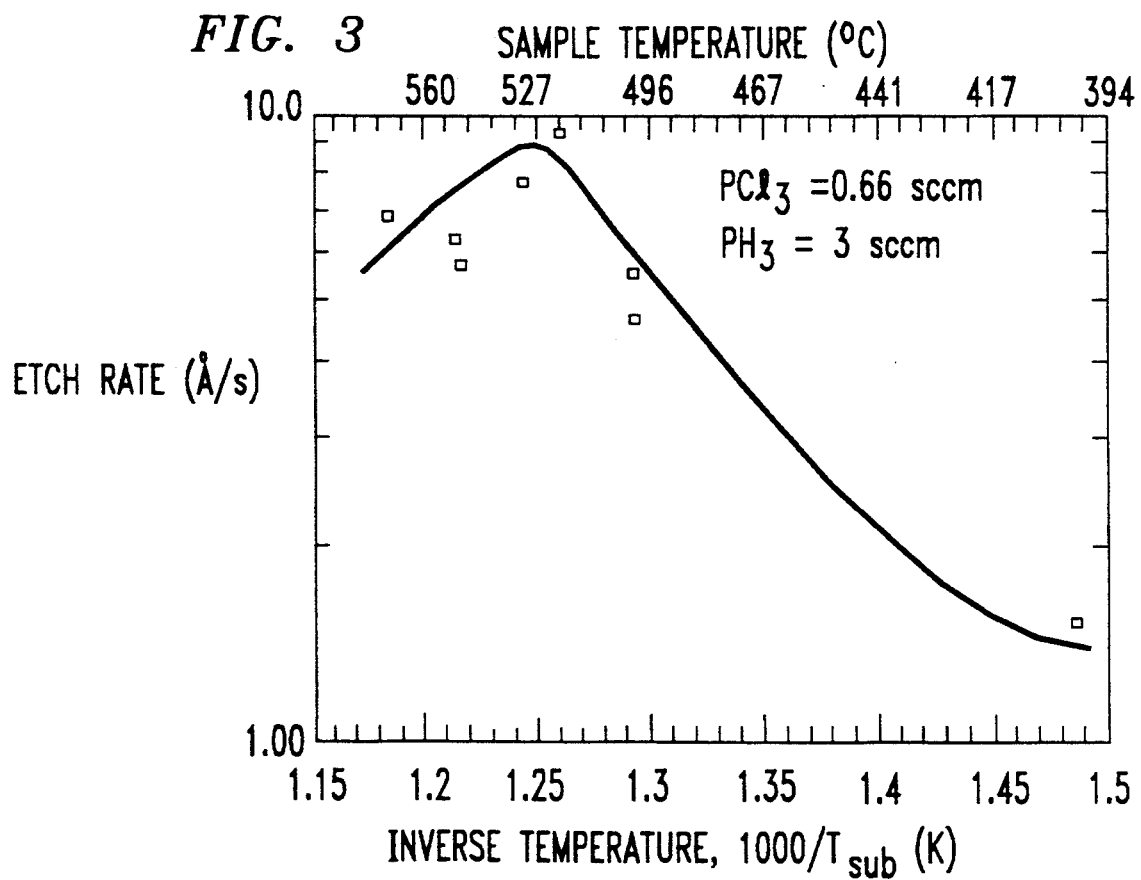

As FIG. 2 illustrates, for otherwise constant conditions the etch rate is substantially linear with $PCl_3$ fluence. FIG. 3 provides exemplary results on the dependence of the etch rate on sample temperature. In the approximate temperature range 400–530° C., the etch rate increases substantially exponentially with temperature. Between about 530° C. and the highest used temperature (about 570° C.) the etch rate appeared to decrease slightly with temperature.

Figure 4:
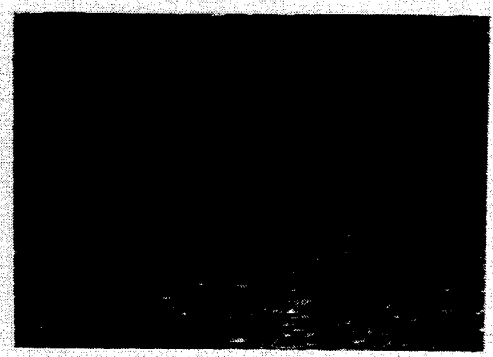
FIGS. 4–6 are optical micrographs, magnification ×700, that illustrate surface morphologies.

Etching at low substrate temperatures (typically ≲450° C.) frequently produced rough surfaces with isotopic fine textures, and is not preferred. At relatively high temperatures (typically ≳530° C.), etching generally resulted in smooth and textureless surface at etch rates ≲0.6 nm/s. At higher etch rates the resulting surfaces were still of high quality but did exhibit some background texture when viewed under a Nomarski optical microscope. See FIGS. 4 and 5, which show optical micrographs of a surface that resulted from etching InP at, respectively, 450° C. at 0.65 nm/s and 550° C. at 1.1 nm/s with $PCl_3$.

Figure 5:
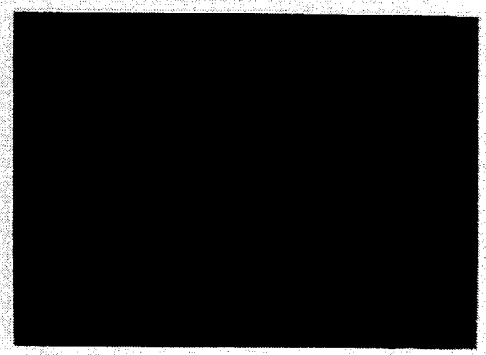

Although surfaces as shown in FIG. 5 will be acceptable for many purposes, it would be very desirable to have available a variant of the inventive etching technique that can produce smooth, textureless surfaces at high (e.g., >0.6 nm/s) etch rates. I have discovered such a variant.

Figure 6:
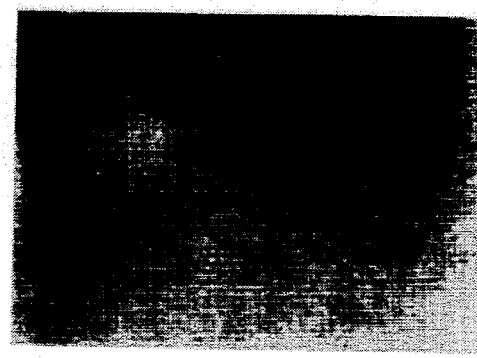

I have made the surprising discovery that addition of an appropriate precursor chemical (e.g., trimethylindium (TMIn) or triethylindium (TEIn) in the case of InP and IN-containing alloys) to the etching medium can result in significantly improved surface morphology, even at etch rates as high as 1 nm/s. See, for instance, FIG. 6, which shows an optical micrograph of a surface that resulted from etching InP at 550° C. with $PCl_3$/TMIn (TMIn flow equivalent to 0.1 nm/s growth rate) at 1 nm/s. The surface orphology was indistinguishable from that of substrates used for the original growth of epitaxial semiconductor material. Such etched surfaces thus can facilitate high quality epitaxial re-growth. Similarly, when etching GaAs or its alloys (e.g., AlGaAs) with $AsCl_3$ or other appropriate etching species, the addition of an appropriate precursor chemical (e.g., triethylgallium or trimethylgallium) can result in improved surface morphology. The precursor compound will typically be provided at a rate that corresponds to a growth rate of at least 0.01 nm/s, preferably at least 0.05 nm/s, with the upper limit selected such that net material removal occurs. However, at least in some circumstances it may be desirable to select the relevant flows such that net material deposition occurs in the presence of an etching compound. Switching between net deposition and net removal is easily accomplished by adjustment of the relevant flow or flows, as those skilled in the art will recognize.

Those skilled in the art will appreciate that etching according to the invention can be used on unmasked surfaces as well as on partially masked surfaces. Exemplarily, a mask comprises a conventionally formed and patterned $SiO_2$ layer on the III/V semiconductor material.

Figure 7:
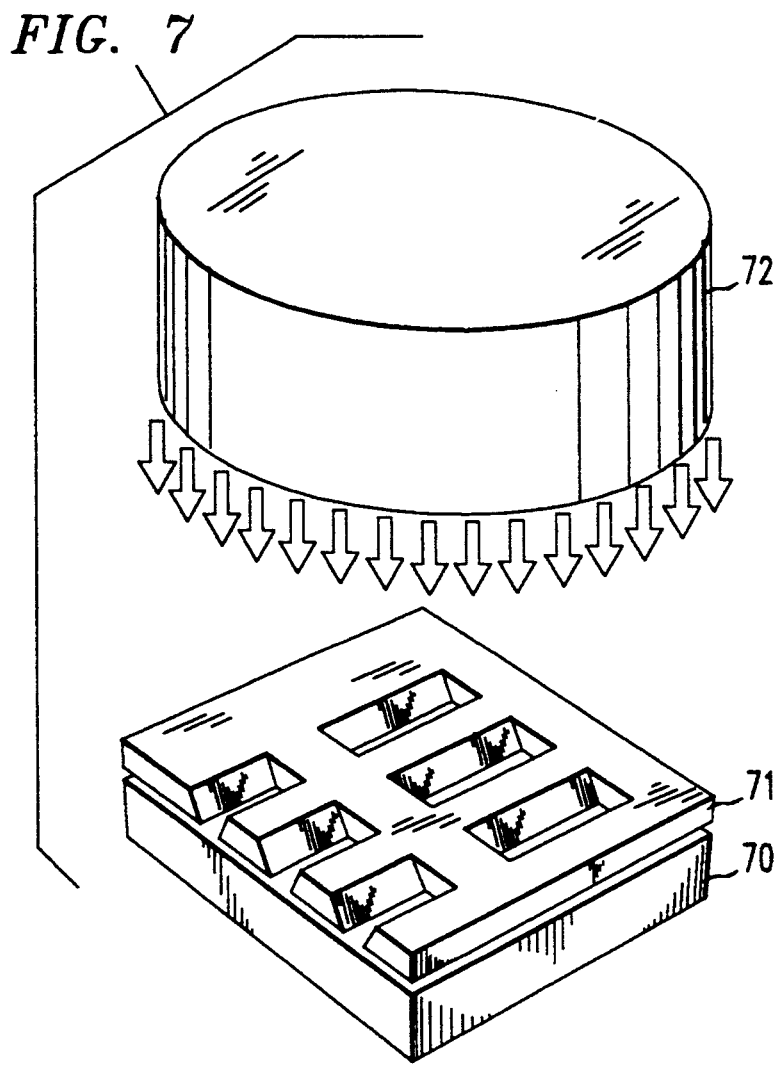
FIG. 7 schematically illustrates selective growth utilizing a shadow mask.
Figure 8:
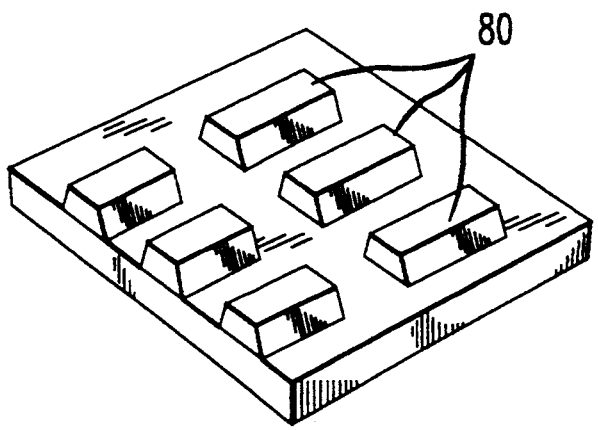
FIG. 8 schematically depicts selectively grown epitaxial semiconductor material.

Patterned epitaxial CBE re-growth not only can be carried out in the apertures of a conventional mask layer, but it can also be carried out by means of a shadow mask held in close contact with the substrate surface. Shadow masks are known (see, for instance, W. T. Tsang, *Applied Physics Letters*, Vol. 46, p. 742). Exemplarily, elongate apertures were formed in a 50 μm thick Si wafer by conventional photolithography and preferential chemical etching. The side walls of the apertures were (111) crystal planes. The mask was held against the III/V semiconductor surface by, e.g., tantalum clamps. Patterned growth was then carried out by exposing the heated masked surface to a beam of appropriate precursor chemicals, as schematically shown in FIG. 7, wherein numeral 70 refers to the III/V semiconductor material, 71 to the shadow mask, and 72 to the particle beam. FIG. 8 schematically shows the resulting semiconductor body, with numeral 80 referring to epitaxial re-grown semiconductor material. In the above described manner, I have selectively grown stripes of, e.g., InP, GaAs, and $In_{0.53}Ga_{0.47}As$ as narrow as 2 μm. Preferential re-growth as described above can optionally be carried out subsequent to etching, also as described above. Furthermore, since the etching medium impinges on the specimen surface as a beam, a shadow mask that is held close to the specimen surface can be used as etch mask.

EXAMPLE 1

A conventional epitaxial multilayer structure on an InP substrate wafer was provided. The structure consisted of: a lower InGaAsP cladding layer (1.0 μm thick; composition corresponding to a bandgap equivalent wavelength $\lambda_g$—1.3 μm); an active layer (0.1 μm tick, $\lambda_g = 1.55$ μm); and an upper cladding layer ( 1.5 μm thick $\lambda_g = 1.3$ μm). On the upper cladding layer was deposited a 0.1 μm thick $SiO_2$ layer by conventional means. The $SiO_2$ layer was patterned by conventional means such that 1.0 μm wide mask stripes remained on the surface. After transfer of the masked wafer into a reactor of the type shown in FIG. 1, the wafer was heated to 545° C. and the wafer surface was exposed to a beam of $PCl_3$ and TMIn ($PCl_3$ flow rate equivalent to 1.1 nm/s etch rate; TMIn flow rate equivalent to 0.1 nm/s growth rate) for approximately 45 minutes. This resulted in removal of the unmasked material to below the substrate/lower cladding layer interface. By switching the beam composition to $PH_3$ and appropriately higher flow of TMIn, etching was terminated and selective area InP re-growth (growth rate 2.0 μm/hr) on the etched surface commenced. Substantially no material was deposited on the mask stripe. This sequence of steps formed the burned heterostructure laser structure in a single etching/regrowth process, without exposure of the device to the ambient atmosphere. After completion of re-growth the wafer was removed from the reactor. The mask stripe was removed and contacts formed, both by conventional means. After conventional preparations, one of the resulting lasers (cavity length 250 μm) was tested. It performed as anticipated, with lasing threshold current of about 20 mA. As will be appreciated by those skilled in the art, the regrown InP can optionally be doped with Fe during regrowth, to render it semi-insulating. It will also be appreciated that the various chemical beams contained appropriate amounts of $H_2$ carrier gas.

EXAMPLE 2

A GaAs heterojunction bipolar transistor (HBT) is fabricated by a method that comprises etching, by exposure of a masked GaAs wafer to a beam of $AsCl_3H_2$ carrier gas and trimethylgallium, down to the p+-doped GaAs base layer. Switching the beam composition to trimethylgallium, pre-cracked $AsH_3$ and an appropriate p-type dopant terminates etching and results in growth of p+-GaAs. No growth occurs over the mask. After removal of the mask by conventional means, and after conventional emitter, base and collector contact formation, a planar HBT with low resistance to the base layer is achieved.

I claim:

1. In a method of making a semiconductor device comprising
    a) providing a semiconductor body that comprises III/V semiconductor material;
    b) removing at least a portion of said III/V semiconductor material by a process that comprises contacting at least a part of said III/V semiconductor material with a gaseous etching medium such that an etched semiconductor surface results; and
    the improvement comprising the method further comprises
    c) carrying out step b) in a reactor chamber with less than $10^{-2}$ Torr background pressure, the reactor chamber comprising means adapted for simultaneously exposing said III/V semiconductor material to a beam or beams of said gaseous etching medium and a III/V semiconductor precursor chemical, and the III/V semiconductor material is exposed, during at least a part of the removing step, to a beam or beams of said gaseous etching medium and the III/V semiconductor precursor chemical.

2. Method according to claim 1, wherein step c) comprises growing, in said reactor chamber and without exposing said etched semiconductor surface to the ambient atmosphere, epitaxial III/V semiconductor material on at least some of said etched semiconductor surface by a process that comprises exposing said etched surface to a beam or beams that comprise said III/V semiconductor precursor chemical.

3. Method according to claim 1, wherein said III/V semiconductor precursor chemical is a compound that comprises an element selected from the group consisting of In and Ga.

4. Method according to claim 1, wherein during at least part of step b) the semiconductor body is at a temperature of at least 450° C.

5. Method according to claim 1, wherein the III/V semiconductor precursor chemical is selected from the group consisting of triethylindium, trimethylindium, triethylgallium and trimethylgallium.

6. Method according to claim 1, wherein the gaseous etching medium is selected from the group consisting of $PCl_3$, $AsCl_3$, carbon tetrachloride and trichlorethane.

7. Method according to claim 1, wherein the device is a laser.

8. Method according to claim 1, wherein the device is a heterojunction bipolar transistor.

9. Method according to claim 2, comprising maintaining a shadow mask in contact with said etched semiconductor surface, such that patterned growth of III/V semiconductor material occurs.

10. Method according to claim 1, comprising maintaining a shadow mask in contact with said semiconductor body, such that patterned removal of III/V semiconductor material occurs.

* * * * *